US007388756B1

(12) United States Patent
Worl et al.

(10) Patent No.: US 7,388,756 B1
(45) Date of Patent: Jun. 17, 2008

(54) METHOD AND SYSTEM FOR ANGLED RF CONNECTION USING A FLEXIBLE SUBSTRATE

(75) Inventors: Robert T. Worl, Renton, WA (US); Bruce L. Blaser, Auburn, WA (US); Peter T. Heisen, Kent, WA (US); Julio A. Navarro, Kent, WA (US); Douglas A. Pietila, Puyallup, WA (US); Scott A. Raby, Redmond, WA (US); Jimmy S. Takeuchi, Mercer Island, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/609,806

(22) Filed: Dec. 12, 2006

(51) Int. Cl.
*H05K 7/00* (2006.01)

(52) U.S. Cl. ....................... 361/760; 361/681; 361/764

(58) Field of Classification Search ................ 361/681, 361/760, 784; 235/439; 257/728, 659
See application file for complete search history.

(56) References Cited

U.S. PATENT DOCUMENTS 5,502,889 A 4/1996 Casson et al. ................ 29/830
5,557,142 A * 9/1996 Gilmore et al. ............. 257/659
5,688,584 A 11/1997 Casson et al. .............. 428/209
6,201,689 B1 * 3/2001 Miyasyo ..................... 361/681
6,950,314 B2 * 9/2005 Reznik et al. .............. 361/764
2002/0053735 A1 * 5/2002 Neuhaus et al. ............ 257/728
2006/0237537 A1 * 10/2006 Empedocles et al. ....... 235/439

* cited by examiner

*Primary Examiner*—Tuan T. Dinh
*Assistant Examiner*—Andargie M Aychillhum
(74) *Attorney, Agent, or Firm*—Klein, O'Neill & Singh, LLP

(57) ABSTRACT

A method and structure for producing an angled RF connection between a first element and a second element using a flexible substrate is provided. The method includes laminating a flexible substrate onto the first element; bending the flexible substrate such that a bonding pad on the flexible substrate is in a similar plane as a bonding pad on the second element; and creating the angled RF connection by wire bonding the bonding pad on the flexible substrate and the bonding pad on the second element. The structure includes a flexible substrate that is laminated onto a first element as an outer layer, flexible substrate having at least one bonding pad, and the flexible substrate able to bend in an angle that places the bonding pad in a same plane as a bonding pad on a second element.

14 Claims, 7 Drawing Sheets

METHOD AND SYSTEM FOR ANGLED RF CONNECTION USING A FLEXIBLE SUBSTRATE

CROSS REFERENCE TO RELATED APPLICATIONS

None

BACKGROUND

1. Field of the Invention

This disclosure is directed to printed wiring boards and more particularly, to an angled RE connection using a flexible substrate.

2. Related Art

Many high-density, high performance electronic systems use a three-dimensional packaging architecture. Many current phased array architectures utilize this three dimensional packaging concept, where the modules are vertically oriented to allow proper lattice spacing for a given frequency. Each module, in general, includes a distribution network, a chip carrier, and a radiator.

High frequency RF signals from a vertically oriented chip set are connected to a horizontally oriented radiator board, also referred to as an Antenna Integrated Printed Wiring Board (AIPWB). Reduction of radiated power during transmit operation and an increase of noise during receive operation are directly proportional to losses caused by this connection. Traditional designs use manually formed wirebonds for connecting these vertical and horizontal assemblies.

Manual wire bonding is typically used because Commercial Off-the-Shelf (COTS) wirebonders cannot produce bonds having bonding pads in different, angled planes with limited access. This manual approach is tedious, consuming assembly time, often requiring manual repairs (touch-up) to produce an acceptable connection, and does not produce a consistently performing RF connection.

Therefore, a structure and method are needed that support an angled RF interconnection between two elements without expensive manual wire bonding, while preserving or enhancing design integrity.

SUMMARY OF THE INVENTION

In one aspect, a method for producing an angled RF connection between a first element and a second element using a flexible substrate is provided. The method includes laminating a flexible substrate onto the first element; bending the flexible substrate such that a bonding pad on the flexible substrate is in a similar plane as a bonding pad on the second element; and creating the angled RF connection by wire bonding the bonding pad on the flexible substrate and the bonding pad on the second element.

In another aspect, a structure for an angled. RF connection is provided. The structure includes a flexible substrate that is laminated onto a first element as an outer layer, flexible substrate having at least one bonding pad, and the flexible substrate able to bend in an angle that places the bonding pad in a same plane as a bonding pad on a second element.

This brief summary has been provided so that the nature of the invention may be understood quickly. A more complete understanding of the invention may be obtained by reference to the following detailed description of embodiments thereof in connection with the attached drawings.

BRIEF DESCRIPTION OF THE DRAWINGS

The foregoing and other features of the embodiments will now be described with reference to the drawings. In the drawings, the same components have the same reference numerals. The illustrated embodiment is intended to illustrate, the adaptive aspects of the present disclosure. The drawings include the following Figures.

DETAILED DESCRIPTION

Definitions

The following definitions are provided as they are typically (but not exclusively) used in relation to printed wiring board technology, referred to by various aspects of the present disclosure.

A "rigid-flexible printed circuit board" or "rigid-flex printed circuit board" is a multi layer interconnect medium where some parts of a circuit board are rigid and other parts maintain some level of flexibility. The term "flex" as used throughout this disclosure means flexible.

A "stickup" is an arrangement where various layers are stacked to form a multi-layer printed circuit board.

"Wire bonding" is a method of making interconnections between two electronic components using a thin round or flattened gold, copper or aluminum wire.

To facilitate an understanding of the preferred embodiment, the general structure and process of making interconnects will be described. The specific structure and process will then be described with reference to the general structure and process.

Conventional processes use a multi-step manual process to produce an angled RF connection. Manual wire bonding is used, because assemblies are not in the same plane and physical access to the assemblies is limited.

Figure 1:
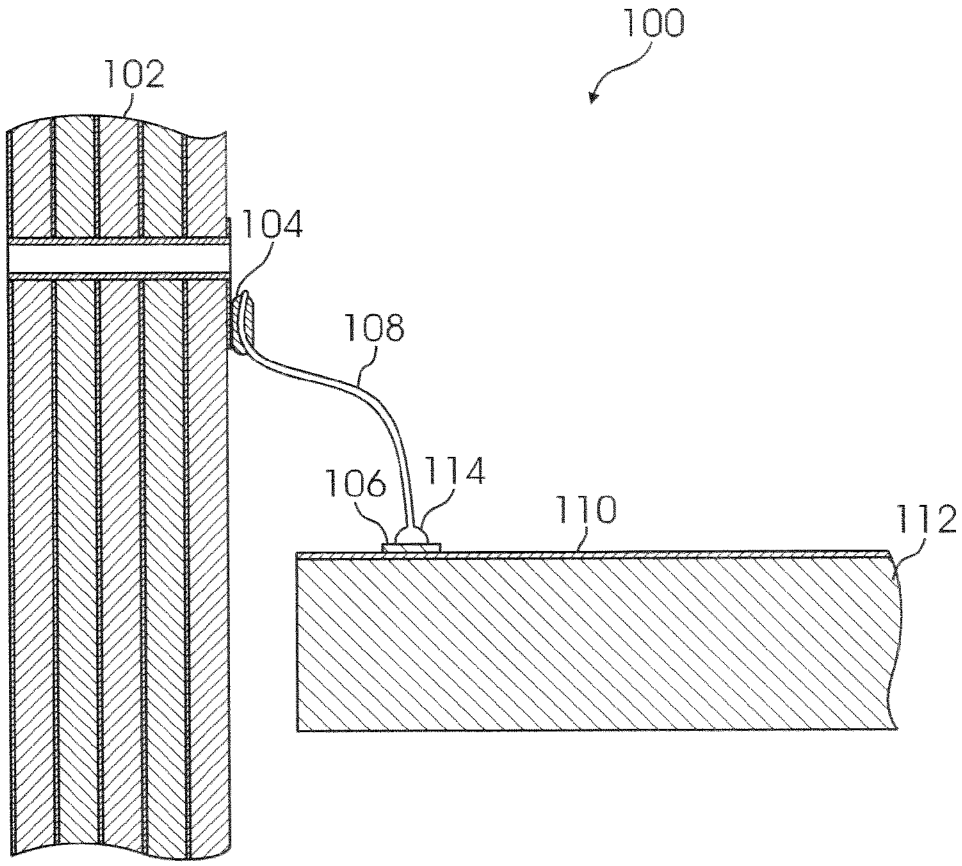
FIG. 1 shows a conventional connection between an AIPWB and a chip carrier.

FIG. 1 shows a conventional interconnect configuration 100 connecting chip carrier 112 with AIPWB 102 via bondwire 108. Bondwire 108 is drawn so that it has enough length to connect AIPWB 102 and chip carrier 112. Bondwire 108 is attached to layer 110 of chip carrier 112 via bonding-pad 106 and connection 114.

The 90 degree RF connection is established when bondwire 108 is connected to AIPWB 102 using conductive epoxy 104. Plural wirebonds are created for a module, for example, 80 wirebonds per module may be created. Wires are manipulated manually and the conductive epoxy is also applied manually. The manual process steps are tedious and can be very expensive.

Figure 2A:
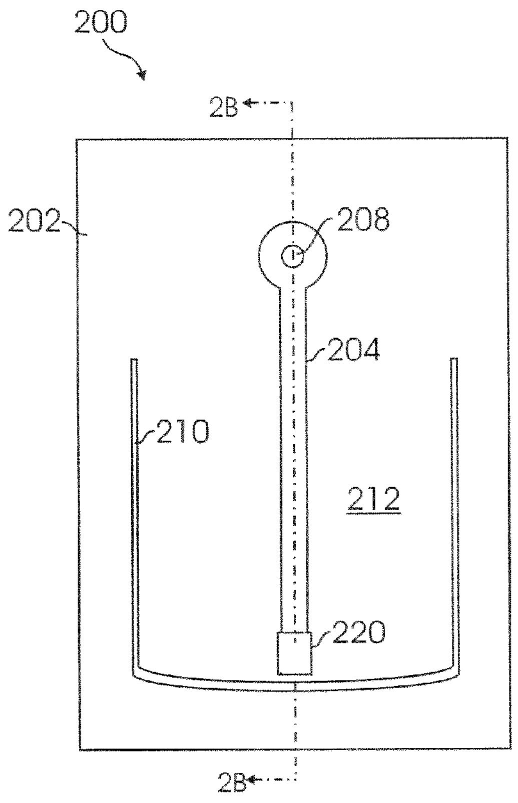
FIGS. 2A and 2B show a top view and a cross sectional view, respectively, of a printed circuit board, according to an embodiment.
Figure 2B:
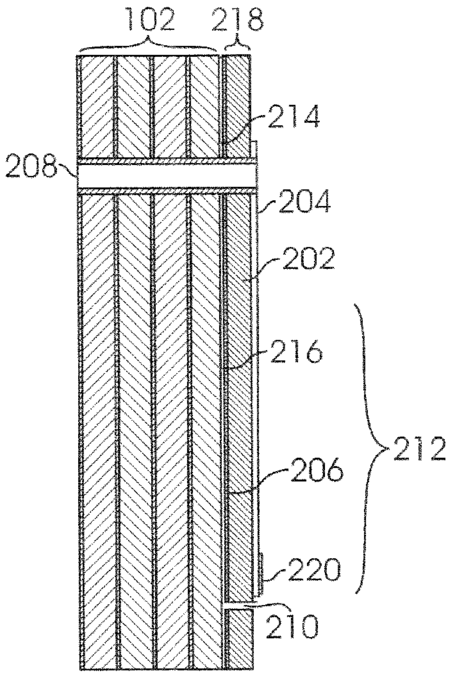

FIGS. 2A and 2B show a rigid-flex AIPWB 200, in accordance with an embodiment of the present disclosure. Rigid-flex AIPWB 200 includes an AIPWB structure 102 and a flexible ("Flex") substrate 218. Flex substrate 218 is laminated on AIPWB 102 as an outer layer. Flex substrate 218 may include a micro-strip construction, which typically includes a signal trace 204, and a single ground plane 206, separated by a low-loss dielectric material 202. Dielectric material 202 functions as an insulating interposer.

Flex substrate 218 is pre-routed along a cutout 210 to define a tab 212. Prepreg 214 is pre-routed to create a void area 216 under tab 212 to allow the tab to be formed at a desired angle. Tab 212 includes signal trace 204. Signal trace 204 is connected to an internal signal trace (not shown) of AIPWB 102 by metal-plated via 208. Signal trace 204 includes bonding-pad 220 whose function is described below with respect to FIG. 3.

Figure 3:
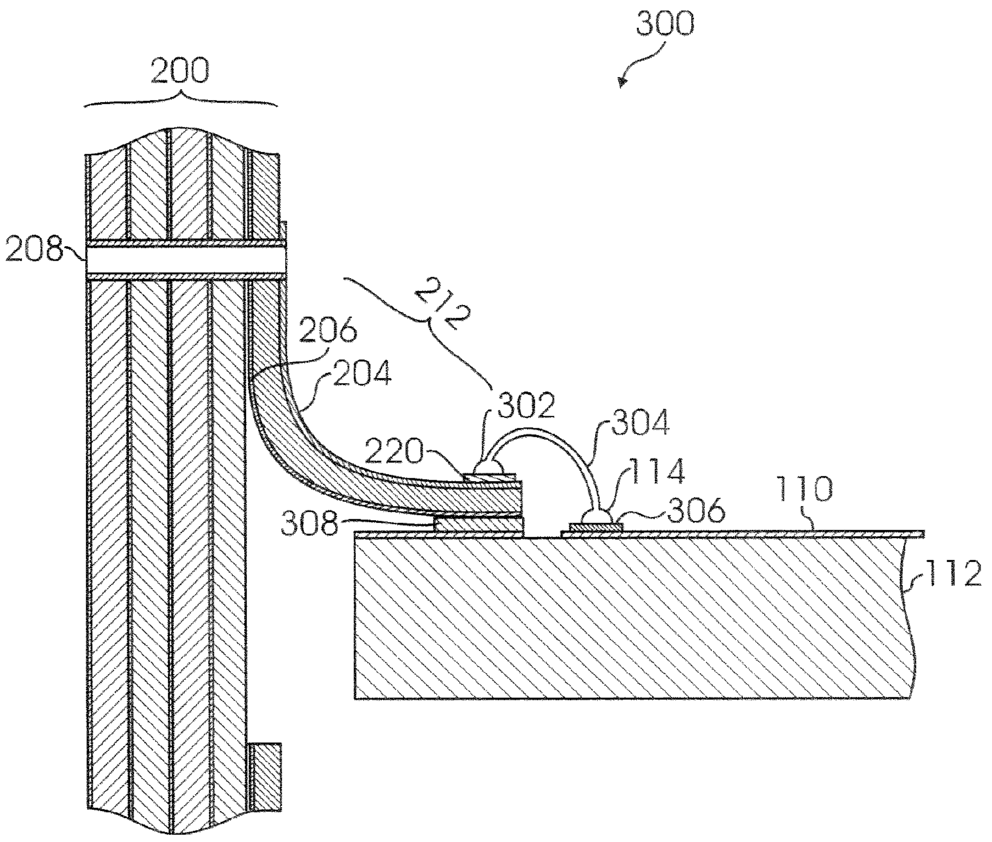
FIG. 3 shows an angled connection between an AIPWB to a chip carrier, according to an embodiment.

FIG. 3 shows an assembly 300 with an angled RF connection between rigid-flex AIPWB 200 and chip carrier 112, in accordance with an embodiment of the present disclosure. Tab 212 is formed at an angles for example, 90 degrees. Tab 212 provides a flexible link between rigid-flex AIPWB 200 and chip carrier 112.

Due to the flexible structure of tab 212, wire bond pad 306 on chip carrier 212, and wire bond pad 220 on tab 212, are in close proximity and on the same plane. This allows one to use an automated wire bonder to create bond 114 on chip carrier 112, and bond 302 on tab 212, respectively. Bondwire 304 is short and tightly controlled, which minimizes signal degradation.

Assembly 300 provides an impedance controlled signal environment, since trace 204 and ground plane 206 form a micro-strip, which keeps the impedance controlled throughout the length of the transition. During the assembly process, ground plane 206 may be connected to chip carrier 212 by conductive epoxy 308.

Figure 4A:
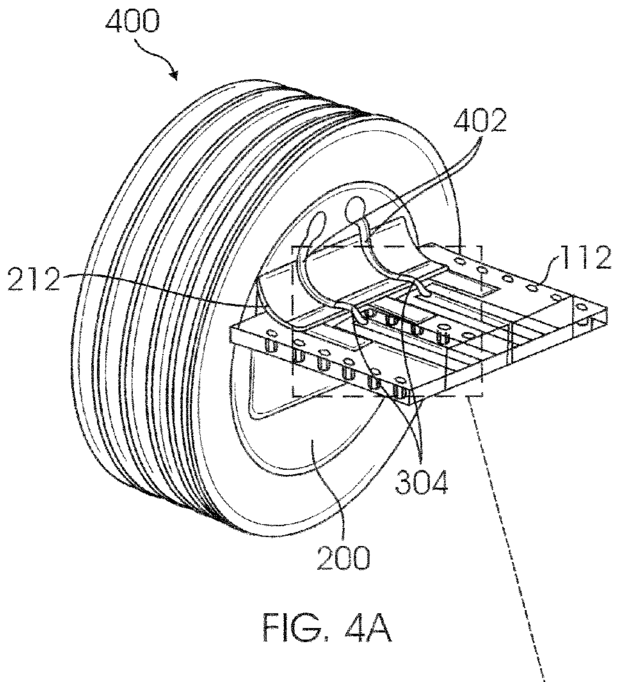
FIG. 4A shows a unit cell of a microwave antenna using an AIPWB and chip carrier interface, according to an embodiment.
Figure 4B:
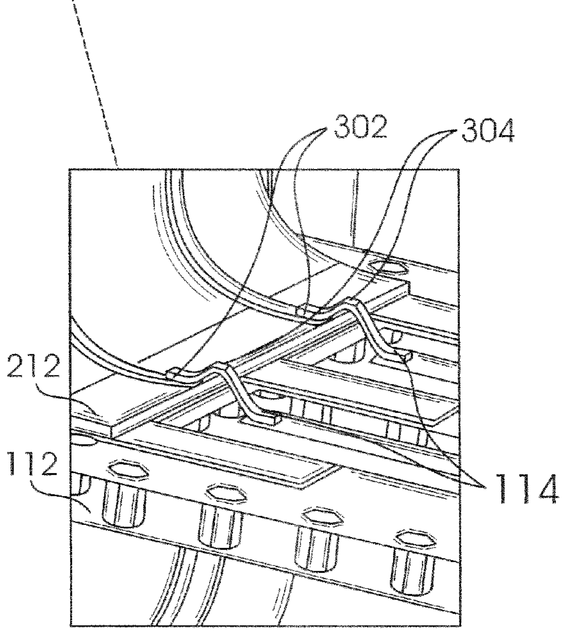
FIG. 4B shows details of a connection between an AIPWB and chip carrier interface, according to an embodiment.

FIGS. 4A and 4B show a three-dimensional assembly 400 of an embodiment of the present disclosure. Assembly 400 includes a radiator cell for a microwave antenna assembly. Each actual microwave antenna assembly (not shown) has between 8 and 16 of these unit cells on a single board. Assembly 400 is constructed using rigid-flex AIPWB 200.

FIG. 4B shows a close up view of a 90 degree angled connection. Tab 212 has two signal traces 402, which are connected to chip carrier 112 with bond wires 304, the close proximity of wire bonding pads 302 and 114 allows the use of short bond wires 304. The illustrated configuration was used as a model, to simulate electrical performance of the angled interconnect, as described below.

Figure 5:
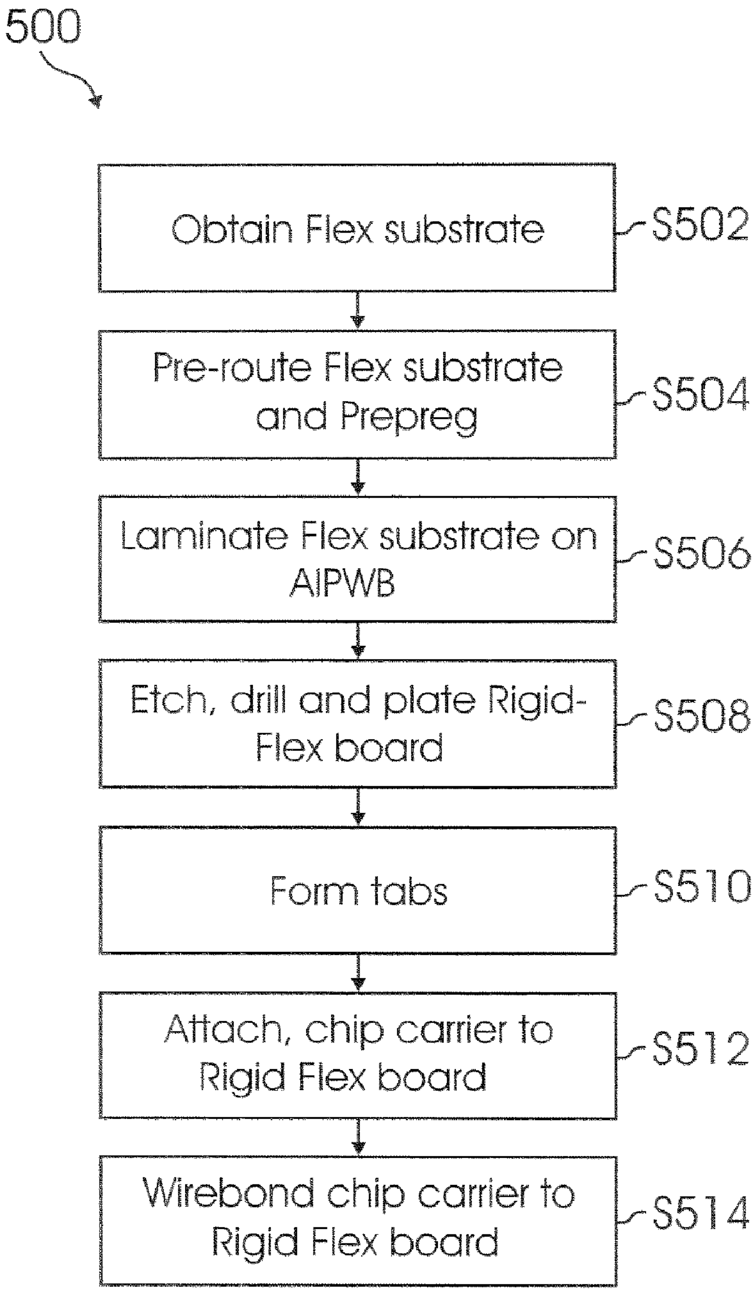
FIG. 5 is a flowchart showing a method of producing a connection between an AIPWB and a chip carrier; according to an embodiment.

FIG. 5 shows a process flow diagram of method 500 for producing an angled RF connection between two elements using a flexible substrate, according to one embodiment.

The process starts in step S502, when flexible substrate 202 is obtained. Various flexible substrates may be used, for example, Rogers R/flex 3600 or 3850 LCP laminate.

In step S504, flexible substrate 202 and Prepreg 216 are pre-routed with the proper pattern 210 that will form tab 212.

In step S506, flexible substrate 202 is laminated on to AIPWB 102 using Prepreg 216.

In step S508, an outside metal layer of flex substrate 202 is etched, via holes 208 are drilled and plated, creating rigid-flex AIPWB 200.

In step S510, tabs 212 are formed to 90 degree, by lifting and bending it away from a surface of rigid-flex AIPWB 200, whereby providing a favorable wire bonding configuration.

In step S512, chip carrier 112 is attached to a rigid portion of rigid-flex AIPWB 200, using epoxy or some other means.

Thereafter, in step S514, chip carrier 112 is wirebonded to rigid-flex AIPWB 200.

This approach is advantageous because it allows the use of COTS automatic wire bonding machines, which produce well-controlled, uniform, and reliable bonds.

Figure 6A:
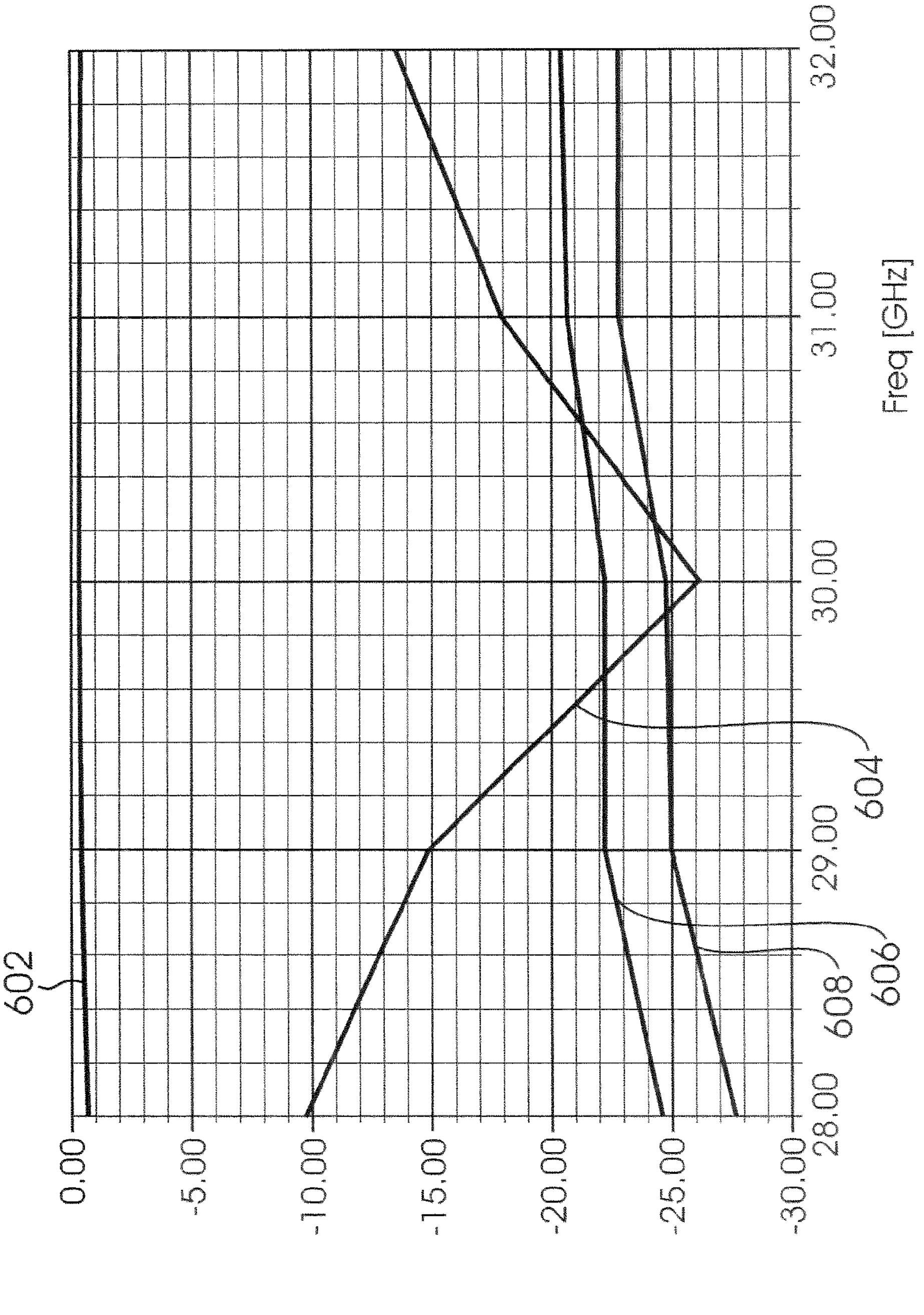
FIGS. 6A and 6B graphically illustrate simulated performance of an angled interconnect, according to an embodiment.

Simulation using assembly 400 was performed using Ansoft's High Frequency Simulation Software Suite. Ansoft's High Frequency Simulation is a commercially available simulation tool for RF and microwave applications. The simulations covered both Ka band (30 GHz) and Q band (44 GHz) frequencies. FIG. 6A shows favorable simulation results, where return loss 604 at 30 GHz is −25 dB, probe isolation 606 and cross-polarization 608, are less than −20 dB at 30 GHz, while insertion loss 602 is −0.3 dB.

Figure 6B:
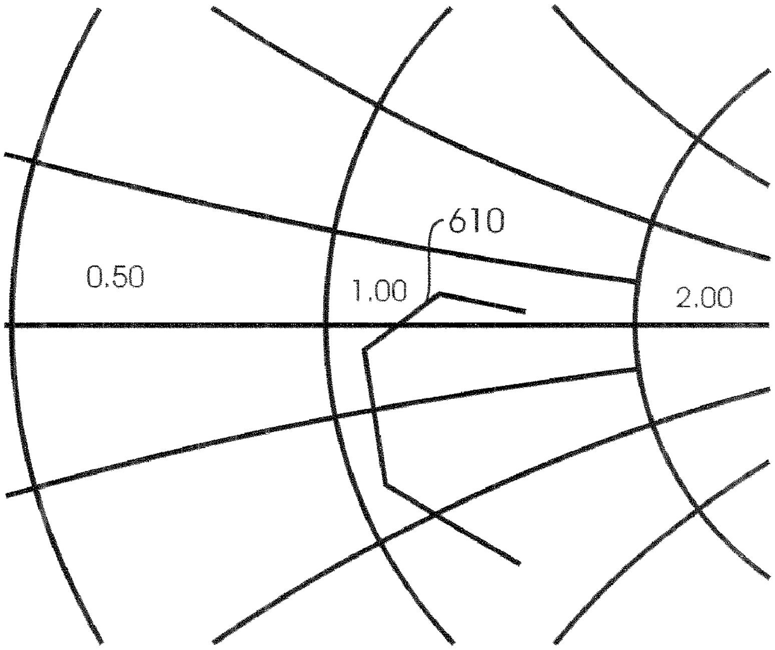

FIG. 6B shows normalized impedance of rigid-flex AIPWB 200. Trace 61-0 shows that 50 Ohm input impedance is closely maintained for various frequencies.

In one aspect, the present disclosure provides solutions for numerous communication and radar phased array industry applications. The foregoing approach reduces assembly time. By providing impedance controlled signal environment throughout a signal propagation path, higher operating frequencies can be achieved.

Although the present disclosure has been described with reference to specific embodiments, these embodiments are illustrative only and not limiting. Many other applications and embodiments of the present disclosure will be apparent in light of this disclosure and the following claims.

What is claimed is:

1. A method for producing an angled RF connection between a first element and a second element using a flexible substrate, comprising:

Creating a void area in a first surface of the first element;

Laminating a flexible substrate onto the first surface of the first element, flexible substrate including a tab overlying the void area; and at least partially covering the first surface of the first element bending the tab such that a bonding pad on the tab is in a plane as coincident with or substantially parallel to a plane occupied by a bonding pad on the second element; and creating the angled RF connection by wire bonding the bonding pad on the flexible substrate tab and the bonding pad on the second element.

2. The method of claim 1, wherein the first element is an antenna integrated printed wiring board.

3. The method of claim 1, wherein the second element is a chip carrier.

4. The method of claim 1, wherein wire bonding is performed by a commercial automated wire bonding machine.

5. The method of claim 1, wherein the flexible substrate includes at least one metal layer.

6. The method claim 1, wherein at least two metal layers form a micro-strip in the flexible substrate.

7. The method of claim 1, wherein the step of creating the void area comprises routing the first surface of the first element.

8. a structure for an angled RF connection, comprising:

A first element including a void area in a first surface thereof;

A second element including a bonding pad; and

A flexible substrate integral with the first element as an outer layer at least

Partially covering the first surface of the first element, the flexible substrate including a tab overlying the void area and having at least one bonding pad positioned on the tab; and Wire bond electrically connecting the bonding pad on the tab and the bonding pad on the second element;

Wherein the tab is configured to bend in an angle that places the bonding pad on the tab in a plane coincident with or substantially parallel to a plane occupied by the bonding pad on the second element.

9. The structure of claim 8, wherein the first element is an antenna integrated printed wiring board.

10. The structure of claim 8, wherein the second element is a chip carrier.

11. The structure of claim 8, wherein the flexible substrate includes at least one metal layer.

12. The structure of claim 8, wherein metal layers form a micro-strip in the flexible substrate.

13. The structure of claim 8, wherein the wire bond is created by a commercial automated wire bonding machine.

14. The structure of claim 8, wherein the void area is created by routing the first surface of the first element.

* * * * *